(12) United States Patent
Hur et al.

(10) Patent No.: US 9,211,500 B2
(45) Date of Patent: Dec. 15, 2015

(54) PLASMA REACTOR FOR ABATING HAZARDOUS MATERIAL

(71) Applicant: KOREA INSTITUTE OF MACHINERY & MATERIALS, Daejeon (KR)

(72) Inventors: Min Hur, Daejeon (KR); Woo Seok Kang, Daejeon (KR); Jae Ok Lee, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 0 days.

(21) Appl. No.: 14/695,161

(22) Filed: Apr. 24, 2015

(65) Prior Publication Data
US 2015/0306540 A1 Oct. 29, 2015

(30) Foreign Application Priority Data

Apr. 29, 2014 (KR) .......................... 10-2014-0051892
Jul. 3, 2014 (KR) .......................... 10-2014-0083093

(51) Int. Cl.
*B01J 19/12* (2006.01)
*B01D 53/32* (2006.01)

(52) U.S. Cl.
CPC ........ *B01D 53/323* (2013.01); *B01D 2259/818* (2013.01)

(58) Field of Classification Search
CPC .......................... B01D 53/323; B01D 2259/818
See application file for complete search history.

(56) References Cited

U.S. PATENT DOCUMENTS

2011/0089017 A1 4/2011 Hur
2013/0087287 A1 4/2013 Hur

FOREIGN PATENT DOCUMENTS

| JP | 2006-297339 | 11/2006 |
|---|---|---|
| JP | 2008-194674 | 8/2008 |
| KR | 10-1063515 | 9/2011 |
| KR | 10-1065013 | 9/2011 |
| KR | 10-2013-0038623 | 4/2013 |

*Primary Examiner* — Kishor Mayekar
(74) *Attorney, Agent, or Firm* — Lex IP Meister, PLLC

(57) ABSTRACT

A plasma reactor for abating hazardous materials by decomposing various hazardous materials in a front end part of a vacuum pump is provided. A plasma reactor for abating hazardous materials includes a ground electrode part, an insulator, and a driving electrode. The ground electrode part includes a first ground electrode located in a front end part of the vacuum pump and having a tubular shape, including a first end part facing the vacuum pump and a second end part at an opposite side thereof, and a second ground electrode connected to a side of the first ground electrode and having a tubular shape and transferring the process gas. The insulator is connectedly installed to the second end part. The driving electrode is fixed to an outer surface of the insulator, a driving voltage is applied while being connected to a power supply, and low pressure plasma is generated inside of the first ground electrode due to a voltage difference from the ground electrode part.

16 Claims, 20 Drawing Sheets

PLASMA REACTOR FOR ABATING HAZARDOUS MATERIAL

CROSS-REFERENCE TO RELATED APPLICATION

This application claims priority to and the benefit of Korean Patent Application Nos. 10-2014-0051892 and 10-2014-0083093 filed in the Korean Intellectual Property Office on Apr. 29, 2014 and Jul. 3, 2014, the entire contents of which are incorporated herein by reference.

BACKGROUND OF THE INVENTION 1. (a) Field of the Invention

The present invention relates to a plasma reactor, and more particularly, to a plasma reactor for attaining an environmentally friendly process by decomposing and removing various hazardous materials in a front end part of a vacuum pump.

2. (b) Description of the Related Art

A process chamber for performing processes such as etching, deposition, cleaning, and so on is installed in a manufacturing line of a semiconductor, a display, a solar cell, and the like, and the process chamber is connected to a vacuum pump to evacuate process gases. Various hazardous materials are discharged from the process chamber, for example, greenhouse gases such as $CF_4$, $CHF_3$, $C_2F_6$, $C_4F_8$, etc., are discharged in the etching process, an undecomposed precursor is emitted in the deposition process, and greenhouse gases and particle by-products such as $NF_3$, $SF_6$, etc. are discharged in the cleaning process.

Restrictions on emissions of the greenhouse gases that cause global warming have been tightened, and the particle by-products deteriorate the vacuum pump while accumulated in the vacuum pump. Most of the precursor used in the deposition process is injected inside of the vacuum chamber in a liquid phase or is vaporized by a bubbler, etc., and the discharged precursor which is not used in the deposition process is the undecomposed precursor. The undecomposed precursor is accumulated inside of the vacuum pump or between the vacuum pump and a scrubber.

Since there is a high temperature difference inside of the vacuum pump when in the operating and non-operating states, the undecomposed precursor in a vapor state and a liquid state coexist. As a result, this may cause an explosion when being excessively expanded while expansion and shrinking are repeated. In addition, the undecomposed precursor accumulated between the vacuum pump and the scrubber is exposed when replacing the vacuum pump, the scrubber, or pipe, and some of this may cause a fire while violently reacting with air.

A plan for utilizing a plasma reactor has been researched in order to decompose or remove various hazardous materials discharged in a process chamber. However, in a case that the hazardous materials flow through the inside of the plasma reactor, problems have been reported that the precursor decomposed by plasma is deposited on a insulator surface of the plasma reactor, or the particle by-products decomposed by plasma and fluorine radicals decomposed from the greenhouse gases etch the insulator surface. A thickness increase of the insulator due to the deposition causes a decrease in decomposition rate of the hazardous materials, and the etching of the insulator causes insulation breakdown.

Also, in the decomposition process of the hazardous materials using plasma, oxygen radicals and hydrogen radicals are required to stabilize the greenhouse gases, and for this, a method of inputting water vapor ($H_2O$) to a front part of the plasma reactor is conventionally used.

However, although the method of inputting the water vapor is good in terms of safety of the process, it has drawbacks that the decomposition rate of the greenhouse gases is low and the amounts of oxygen and hydrogen are unable to be individually controlled. In addition, there is a technical difficulty in finely controlling the input of water vapor, and there is a limit that the entire system becomes complex since additional equipment such as a bubbler are required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention relates to a plasma reactor for decomposing and removing various hazardous materials in a front part of a vacuum pump, and to provide a plasma reactor for abating hazardous materials that enables a precursor decomposed by plasma, particle by-products, and fluorine radicals to not influence an insulator of the plasma reactor, thereby increasing durability and a decomposition rate of the hazardous materials.

In addition, the present invention provides a plasma reactor for an environmentally friendly process that increases the decomposition rate of greenhouse gases while guaranteeing safety of a process not using water vapor, and simplifies the entire system since it does not require additional equipment such as a bubbler.

A plasma reactor for abating hazardous materials according to an exemplary embodiment of the present invention includes a ground electrode part, an insulator, and a driving electrode. The ground electrode part includes a first ground electrode located in a front end part of the vacuum pump and having a tubular shape and including a first end part facing the vacuum pump and a second end part at an opposite side thereof, and a second ground electrode connected to a side of the first ground electrode and having a tubular shape and transferring the process gas. The insulator is connectedly installed to the second end part. The driving electrode is fixed to an outer surface of the insulator, a driving voltage is applied while being connected to a power supply, and low pressure plasma is generated inside of the first ground electrode due to a voltage difference from the ground electrode part.

The insulator may include a first insulating part fixed to the second end part and having a tubular shape parallel with the first ground electrode and a second insulating part forming a first injection hole into which a first reaction gas is injected and having a planar shape that covers the first insulating part. The driving electrode may be fixed to an outer circumference of the first insulating part in a ring shape.

A second injection hole for injecting a second reaction gas may be formed at the second ground electrode, and a residence time when the first reaction gas stays inside of the plasma may be different from a residence time when the second reaction gas stays inside of the plasma.

Diameters of the second end part and the first insulating part may be greater than a diameter of the first end part. The first ground electrode may include a uniform diameter part contacting the first end part and a variable diameter part contacting the second end part. A length of the variable diameter part may be smaller than a length of the uniform diameter part, and the second ground electrode may contact an end part of the uniform diameter part contacting the variable diameter part.

The plasma reactor may further include a third ground electrode located inside of the first ground electrode and between the second ground electrode and the first end part. The second ground electrode may contact the second end part or is spaced apart from the second end part, and the entire first ground electrode may be formed with a uniform diameter. The first insulating part may be formed with a diameter that is the same as or smaller than a diameter of the first ground electrode.

The insulator may be formed with a planar shape that covers the second end part, and the driving electrode may be fixed to an outer surface of the insulator with a planar shape.

The third ground electrode may be formed with a planar shape that intersects an inner wall of the first ground electrode, and may pass the process gases by being spaced apart from the first ground electrode or forming at least one opening. The third ground electrode may be formed with a tubular shape fixed to an inner wall of the first ground electrode, and may be formed with an opening of which width decreases farther to the insulator.

The plasma reactor may include a pipe member of which an end is blocked and is attached at a side surface of the first ground electrode that faces the second ground electrode in order to increase residence time of the process gases. A part of the first ground electrode surrounding the third ground electrode may be expanded and functions as a particle collecting box, and the third ground electrode may be formed with a larger diameter than a diameter of the first ground electrode in the particle collecting box.

The third ground electrode may be connected to the first ground electrode via a supporting part fixed at a lower surface, and the supporting part may form at least one opening for passing the process gases. The first ground electrode may include a first part connected to a side surface of the particle collecting box with the first end part and a second part connected to an upper surface of the particle collecting box with the second end part.

One of the first reaction gas and the second reaction gas may include oxygen, and the other may include hydrogen or a hydrocarbon. One of the first reaction gas and the second reaction gas may be dissociated prior to the other.

The process gases may not flow through inside of the insulator. Accordingly, a decrease of decomposition rate of hazardous materials which occurs by a precursor decomposed by plasma being deposited on the insulator surface can be prevented, and durability of the plasma reactor can be increased by preventing a phenomenon in which a fluorine radical decomposed from greenhouse gases etches the insulator surface. In addition, when a third ground electrode is located in the first ground electrode, since it is possible to generate strong plasma at the center of the first ground electrode, the phenomenon that plasma density at the center area of the first ground electrode decreases as operation pressure increases can be suppressed, and the decomposition rate of hazardous materials is not decreased even when the operation voltage increases.

The plasma reactor is separately provided with an oxygen supply and a hydrogen (or hydrocarbon) source supply, two sorts of reaction gases are separately injected through two injection parts, and thereby the decomposition rate of hazardous substances included in the process gases can be effectively increased in comparison with the conventional art. In addition, safety of a process can be secured since explosion is avoidable by having different dissociation times of oxygen and hydrogen (or a hydrocarbon).

DETAILED DESCRIPTION OF THE EMBODIMENTS

Hereinafter, the present invention will be described more fully hereinafter with reference to the accompanying drawings, in which exemplary embodiments of the invention are shown. The present invention may be implemented in various forms, and the scope of the present invention is not limited the embodiments described herein.

Figure 1:
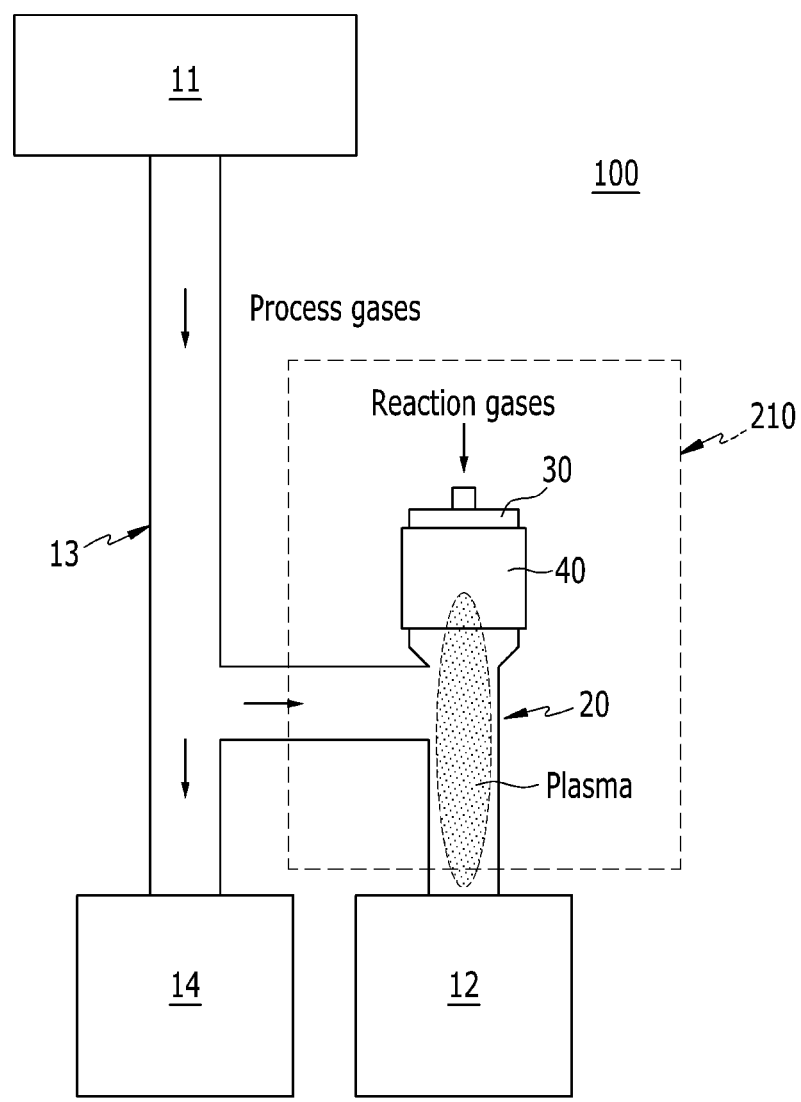
FIG. 1 is a schematic diagram of a process system including a plasma reactor according to the first exemplary embodiment of the present invention.

FIG. 1 is a schematic diagram of a process system including a plasma reactor according to the first exemplary embodiment of the present invention. The process system of FIG. 1 may be a low pressure process system for semiconductors, displays, solar cells, and so on.

Referring to FIG. 1, a process system 100 includes a process chamber 11 in which tasks such as etching, deposition, cleaning, etc. are processed, a vacuum pump 12 that discharges process gases of the process chamber 11, and a plasma reactor 210 connectedly installed on a pipe 13 between the process chamber 11 and the vacuum pump 12. The process system 100 is installed in parallel with the vacuum pump 12 in a rear part of the process chamber 11, and may further include a particle collecting part 14 that collects particles having a size of 1 μm or more.

The plasma reactor 210 is connectedly installed between the pipe 13 between the process chamber 11 and the vacuum pump 12 and a front part of the vacuum pump 12, and the inside thereof maintains a low pressure like the pipe 13. Herein, the low pressure signifies a pressure in a range of about 0.01 Torr to 10 Torr, but is not limited to the range. The plasma reactor 210 includes an injection hole to which reaction gases are injected.

The plasma reactor 210 decomposes various hazardous materials (greenhouse gases, undecomposed precursor, particle by-products, etc.) included in the process gases by generating plasma at a low pressure and a high temperature therein. The decomposed components are chemically bound with reaction gases and change to harmless compounds. Since the plasma includes a large amount of reactive species and high energy electrons, the plasma promotes a chemical reaction with the decomposed components of the hazardous materials with the reaction gases.

Plasma reactors 210, 220, 230, 240, 250, 260, 270, 280, 290, 300, 310, 320, 330, and 340 of first to fourteenth exemplary embodiments described below generate plasma in a capacitively coupled plasma method and are provided with an AC power supply, and have a structure for improving discharge efficiency while minimizing damage of an insulator. Such characteristics enable a decrease in the installation cost and the maintenance cost and increase decomposition performance of the hazardous materials, thereby effectively elongating the useful life of a plasma reactor.

First, a detailed structure and operation of a plasma reactor according to the first to ninth exemplary embodiments will be described by reference to FIG. 2 to FIG. 12.

Figure 2:
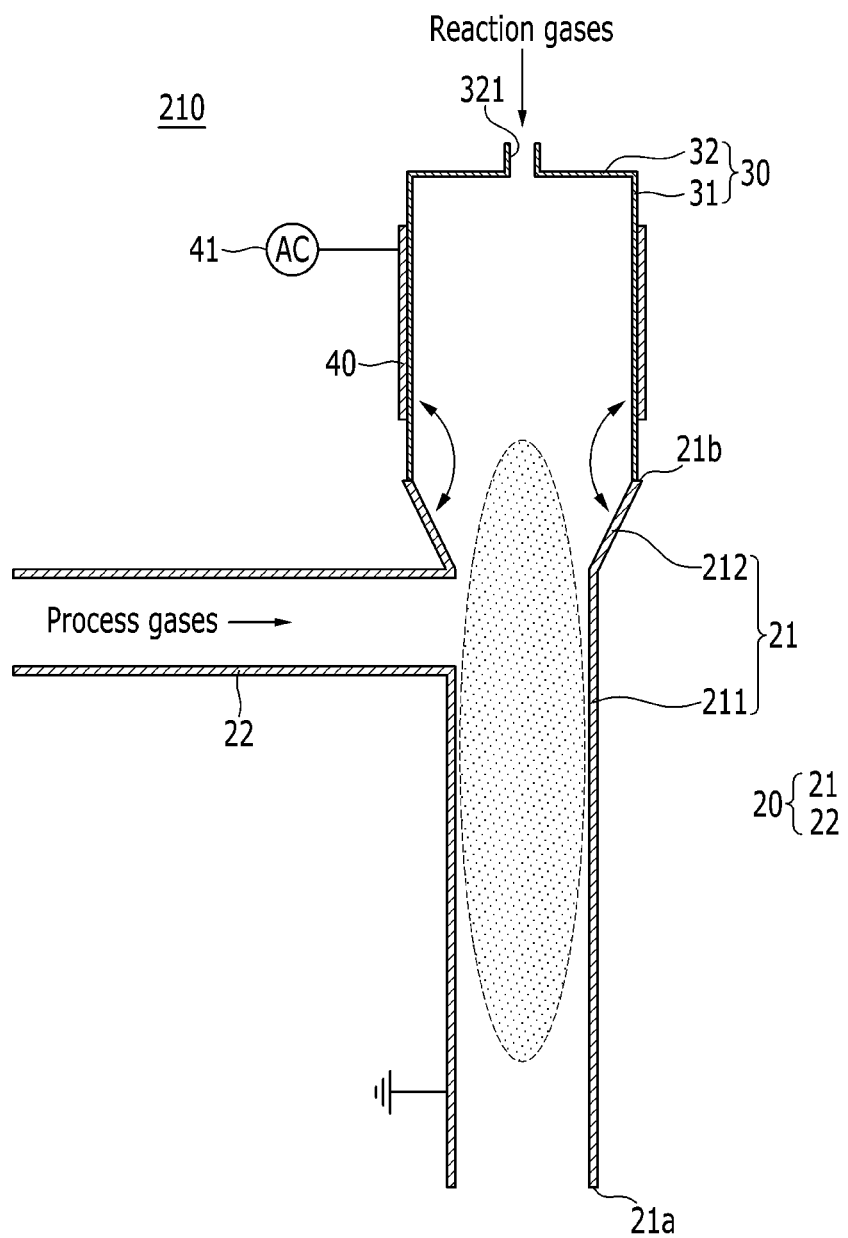
FIG. 2 is a cross-sectional view of a plasma reactor according to the first exemplary embodiment of the present invention.

FIG. 2 is a cross-sectional view of a plasma reactor according to the first exemplary embodiment of the present invention.

Referring to FIG. 1 to FIG. 2, a plasma reactor 210 according to the first exemplary embodiment includes a ground electrode part 20 located in a front end part of the vacuum pump 12, an insulator 30 connectedly installed to the ground electrode part 20, and a driving electrode 40 fixed onto the outer surface of the insulator 30. A driving voltage required for plasma discharge is applied to the driving electrode 40 which is connected to an AC power supply 41.

The ground electrode part 20 includes a first ground electrode 21 of a tubular shape including a first end part 21a facing the vacuum pump 12 and a second end part 21b at an opposite side, and a second ground electrode 22 of a tubular shape that transfers process gases and which is connected to a side of the first ground electrode 21. The second ground electrode 22 is spaced apart with both of the first and second end parts 21a and 21b, but is located near the second end part 21b such that the process gases flow through the inside of the first ground electrode 21 with a sufficient length.

The first and second ground electrodes 21 and 22 have a cylindrical shape, and have an identical diameter or different diameters from each other. FIG. 2 illustrates a case that the first ground electrode 21 has a greater diameter than that of the second ground electrode 22. The first and second ground electrodes 21 and 22 are made of a metal such as stainless steel and so on, and may include a pipe that connects the process chamber 11 and the vacuum pump 12. That is, the pipe 13 between the process chamber 11 and the vacuum pump 12 is grounded, and the first and second ground electrodes 21 and 22 may function as the ground electrode part 20.

The insulator 30 is connected to a second end part 212 of the first ground electrode 21, and forms a tubular shape wholly parallel with the first ground electrode 21. The insulator 30 may include a first insulating part 31 that is fixed to the second end part 212 and has a tubular shape parallel with the first ground electrode 21, and a second insulating part 32 that forms a first injection hole 321 to which reaction gases are injected and has a planar shape that covers the first insulating part 31. The reaction gases may include $O_2$ or $H_2O$, and argon gas may be used as a carrier gas to transfer the reaction gases. The reaction gas plays the role of stabilizing the decomposed hazardous materials.

The first insulating part 31 has a cylindrical shape, and the second insulating part 32 has a disk shape. The first insulating part 31 may be arranged such that its central axis is on the central axis of the first ground electrode 21. The insulator 30 may be made of alumina, glass, quartz, or the like. The driving electrode 40 is fixed to an outer circumference of the first insulating part 31 in a ring shape (cylindrical shape), and spaced apart by a predetermined distance with the second end part 212 and the second insulating part 32.

A diameter of the second insulating part 31 of the second end part 21b may be greater than a diameter of the first end part 21a. The first ground electrode 21 may include a uniform diameter part 211 contacting the first end part 21a, and a variable diameter part 212 contacting the second end part 21b. The variable diameter part 212 has a diameter that is gradually decreased farther from the insulator 30, and the length of the uniform diameter part 211 is much greater than that of the variable diameter part 212. The second ground electrode 22 may be connected to an end part of the uniform diameter part 211 that contacts the variable diameter part 211.

Figure 3:
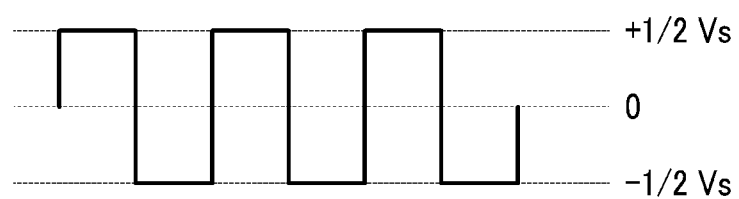
FIG. 3 illustrates an example of a waveform which is applied to the driving electrode of the plasma reactor shown in FIG. 2.

Through the driving electrode 40 connected to the AC power supply 41, a high voltage in a range of several kilohertz to several hundred kilohertz (e.g., 1 kHz to 999 kHz) may be applied. FIG. 3 illustrates an example of a waveform which is applied to the driving electrode. The driving voltage Vs applied to the driving electrode is a high voltage in the frequency range of 1 kHz to 999 kHz, and the operating voltage shows variable forms with a positive value (½Vs) and a negative value (−½Vs) being periodically changed. FIG. 3 illustrates a square waveform as an example, but various waveforms such as a triangle waveform and a sine waveform may be applied as well.

When the driving voltage is applied to the driving electrode 40, plasma discharge is induced due to the voltage difference between the driving electrode 40 and the ground electrode part 20 inside of the plasma reactor 210 (particularly, inside of the insulator 30 and the first ground electrode 21). The discharge occurs when the operation voltage is higher than a breakdown voltage of the internal gases. Since the insulator 30 is also a dielectric material, the discharge current increases with time but decreases as the amount of wall charges piled on the insulator 30 surface become great.

That is, as the discharge current increases after starting the discharge, the wall charges are generated due to the space charges in the plasma piled on a surface of the insulator 30, and the discharge becomes weak due to the wall voltage of the insulator 30 over time. The plasma discharge repeats the processes of generation, sustain, and extinction while the applied voltage is maintained. Accordingly, the discharge is not transferred to arc discharge, and removes hazardous materials exhausted from the process chamber 11 while being maintained in a glow region.

The above-described plasma reactor 210 is provided with the insulator 30 of a cylindrical shape, and process gases do not flow through the insulator 30. That is, the plasma reactor 210 has characteristics of decomposing and removing hazardous materials by generating strong plasma inside of the first ground electrode 21 through which process gases flow while decreasing a contacting surface between the process gases and the insulator 30 by spacing the insulator 30 apart from a flow path of the process gases.

Accordingly, in the structure of the plasma reactor 210 described above, the phenomenon that the precursor decomposed by plasma is deposited on a surface of the insulator 30 or the particle by-products decomposed by plasma and fluorine radicals decomposed from greenhouse gases etch the surface of the insulator 30. As a result, a fall in decomposition rate of the hazardous materials owing to a thickness increase of the insulator 30 can be prevented, and durability of the plasma reactor 210 can be effectively increased by precluding the possibility of insulation breakdown due to etching of the insulator 30.

In addition, as the insulator 30 directly connects the variable diameter part 212 of the first ground electrode 21, the discharge path is shortened when plasma discharge is induced from the voltage difference between the driving electrode 40 and the ground electrode part 20. That is, the variable diameter part 212 of the first ground electrode 21 causes a similar effect to that of the facing discharge. Accordingly, since stronger plasma discharge is generated for the same power consumption, the efficiency of the plasma discharge and the decomposition performance of hazardous materials can be increased.

Figure 4:
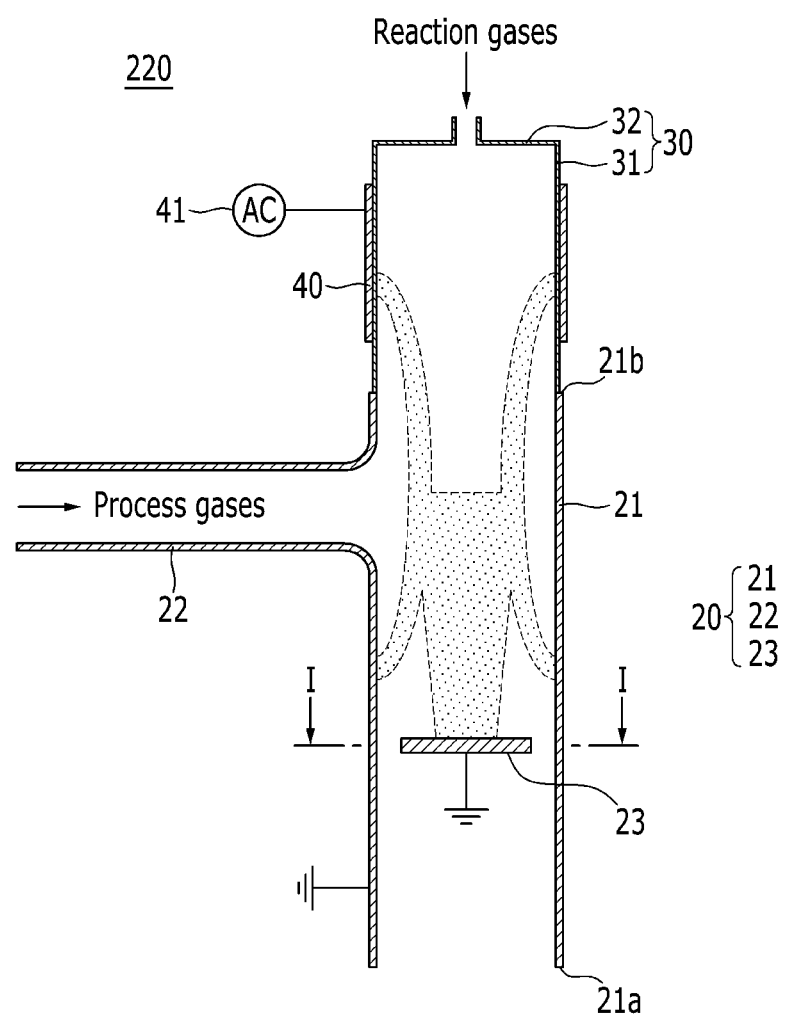
FIG. 4 is a cross-sectional view of a plasma reactor according to the second exemplary embodiment of the present invention.
Figure 5A:
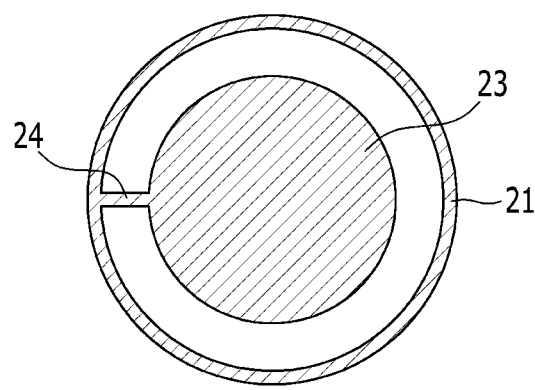
FIG. 5A is a cross-sectional view of a plasma reactor cut along an I-I line of FIG. 4.

FIG. 4 is a cross-sectional view of a plasma reactor according to the second exemplary embodiment of the present invention, and FIG. 5A is a cross-sectional view of a plasma reactor cut along an I-I line of FIG. 4.

Referring to FIG. 4 and FIG. 5A, the plasma reactor 220 according to the second exemplary embodiment includes similar elements to the plasma reactor of the first exemplary embodiment, except that a third ground electrode 23 is additional disposed inside of the first ground electrode 21. The same reference numerals are used for members that are the same as in the first exemplary embodiment, and different parts from the first exemplary embodiment will be mainly described.

The third ground electrode 23 is located inside of the first ground electrode 21 and between the first end part 21a and the second ground electrode 22, and intersects an inner wall of the first ground electrode 21 and has a disk shape. The third ground electrode 23 is formed with a smaller diameter than an inner diameter of the first ground electrode 21, and may be electrically connected to the first ground electrode 21 while maintaining a predetermined location by being fixed to an inner wall of the first ground electrode 21 through at least one connection part 24.

The process gases are released through a space between the inner wall of the first ground electrode 21 and the third ground electrode 23. In the plasma reactor 220 according to the second exemplary embodiment further including the third ground electrode 23, the pressure dependency of the decomposition rate of hazardous materials can be decreased by increasing plasma density in the center of the first ground electrode 21.

In the structure of which the third ground electrode 23 is not provided inside of the first ground electrode 21, the decomposition rate of hazardous materials may vary depending on an operation pressure. For example, a tendency may be shown that plasma is concentrated near the inner wall of the first ground electrode 21 as the operating pressure becomes higher, and the number of high energy electrons decreases at the interior center of he first ground electrode 21 and intensity of oxygen radicals decreases.

The high energy electrons generated by the plasma discharge decomposes hazardous materials by colliding mainly with hazardous materials, and the oxygen radicals chemically react with the decomposed components and changes them into harmless elements. Accordingly, in the structure not provided with the third ground electrode 23, the decomposition rate of hazardous materials may be decreased at the center of the first ground electrode 21 as the operating pressure increases.

In the plasma reactor 220 according to the second exemplary embodiment, since plasma is generated between the driving electrode 40 and the third ground electrode 23 as well as between the driving electrode 40 and the first ground electrode 21, strong plasma can be generated at the center of the first ground electrode 21. As a result, a phenomenon that the plasma density is decreased in the central area of the first ground electrode 21 as the operating pressure increases can be suppressed, and the decomposition rate of hazardous materials is not decreased even in case that the operating pressure increases.

Meanwhile, different from the first exemplary embodiment, according to the second exemplary embodiment, the whole first ground electrode 21 of the plasma reactor 220 may be formed with a uniform diameter, and the first insulating part 31 may have the same diameter (inner diameter) as the first ground electrode 21. In order to prevent arcing, the connection part between the first ground electrode 21 and the second ground electrode 22 may be formed with a rounded shape with a predetermined curvature.

Figure 5B:
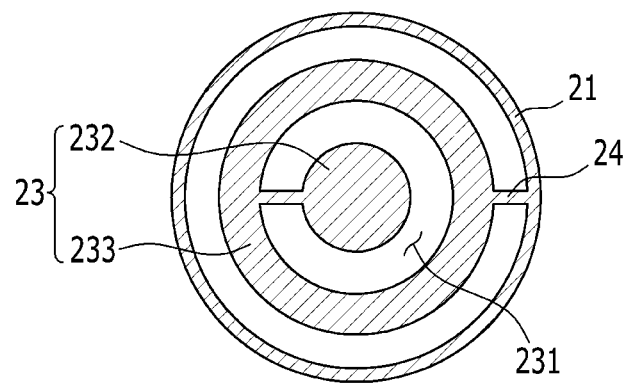
FIG. 5B is a cross-sectional view of a first exemplary variation of the third ground electrode shown in FIG. 5A.

FIG. 5B is a cross-sectional view of a first exemplary variation of the third ground electrode shown in FIG. 5A.

Referring to FIG. 5B, in the first exemplary variation, vacuum exhaust may be more smoothly performed by forming at least one opening 231 in the third ground electrode 23. The at least one opening 231 formed through the third ground electrode 23 may have a shape of the letter C. In this case, the third ground electrode 23 includes a central part 232 of a circular shape and a peripheral part 233 of a ring shape which is connected to the central part 232.

Figure 5C:
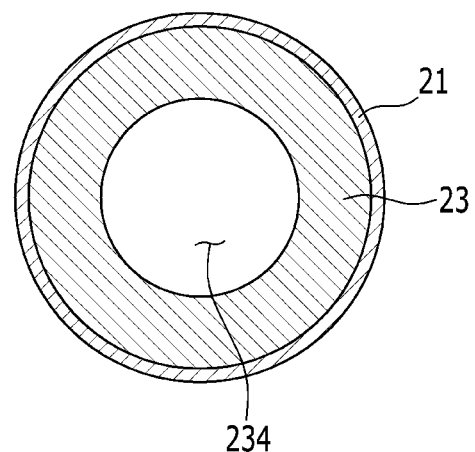
FIG. 5C is a cross-sectional view of a second exemplary variation of the third ground electrode shown in FIG. 5A.

FIG. 5C is a cross-sectional view of a second exemplary variation of the third ground electrode shown in FIG. 5A.

Referring to FIG. 5C, in the second exemplary variation, the whole edge of the third ground electrode 31 is fixed to the inner wall of the first ground electrode 21, and an opening 234 is formed at the center. The opening 234 may have a circular shape, and process gases are released through the opening 234.

Figure 6:
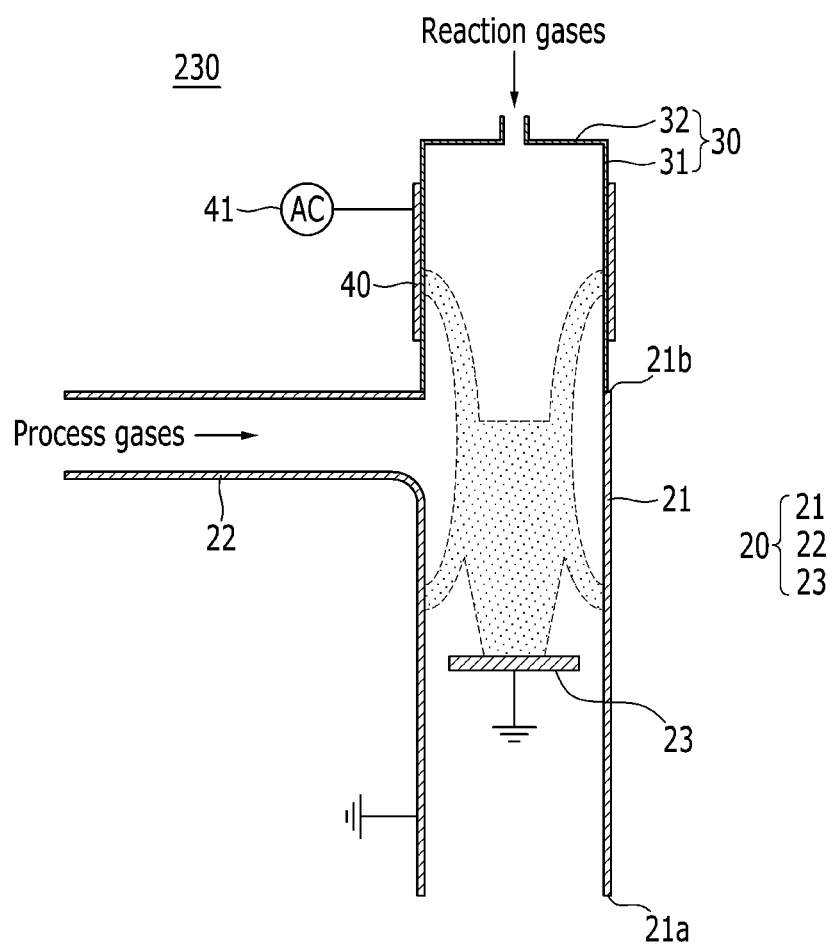
FIG. 6 is a cross-sectional view of a plasma reactor according to the third exemplary embodiment of the present invention.

FIG. 6 is a cross-sectional view of a plasma reactor according to the third exemplary embodiment of the present invention.

Referring to FIG. 6, the plasma reactor 230 according to the third exemplary embodiment includes the same elements as the second exemplary embodiment described above, except that the second ground electrode 22 contacts the end part 21b of the first ground electrode 21 and is connected to the first ground electrode 21. The same reference numerals are used for the same elements as the second exemplary embodiment, and different parts from the second exemplary embodiment are mainly described below.

The insulator 30 contacts both of the first ground electrode 21 and second ground electrode 22. Although there is a difference in a structure of the third exemplary embodiment that plasma is not generated in a portion contacting the insulator 30 and the second ground electrode 22, there is no substantial difference in the decomposition rate of hazardous materials owing to the difference in the contacting structure of the first and second ground electrodes 21 and 22 since strong plasma is generated inside of the first ground electrode 21 due to the third ground electrode 23.

The plasma reactor 230 according to the third exemplary embodiment may be easily applied to a pipe line between the process chamber 11 and the vacuum pump 12 that are already installed to a process system by simplifying the contacting structure between the first and second ground electrodes 21 and 22 and the insulator 30. DeletedTexts 집속 In the plasma reactor 230 according to the third exemplary embodiment, the third ground electrode 23 may be replaced by the third ground electrode shown in FIG. 5B and FIG. 5C.

Figure 7:
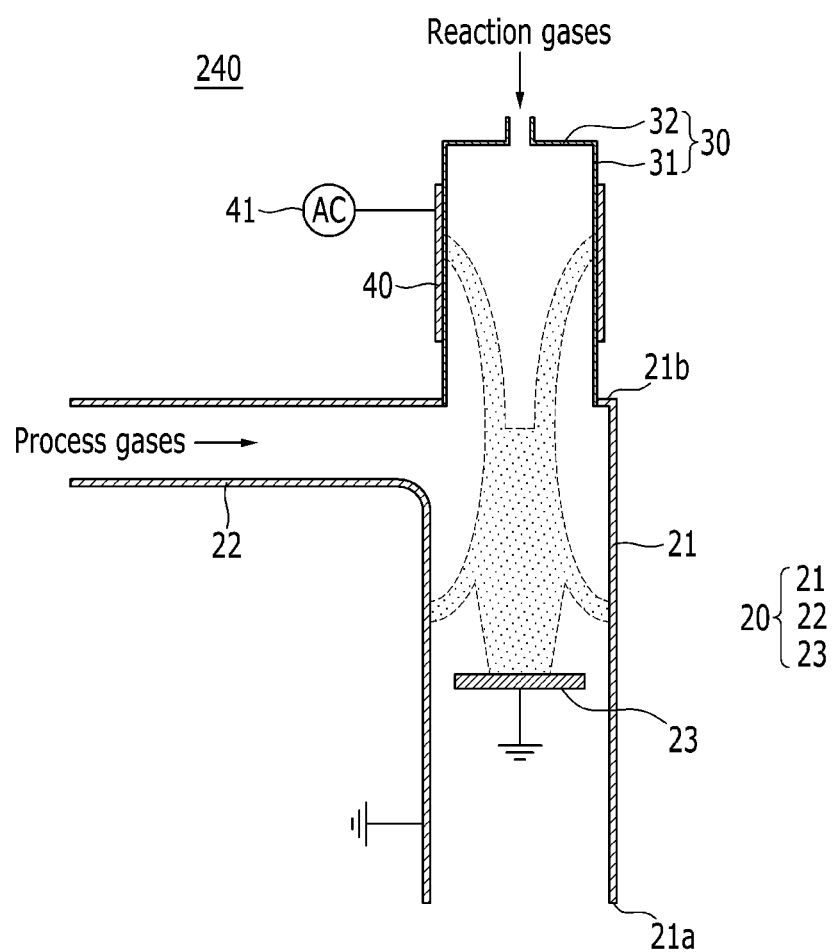
FIG. 7 is a cross-sectional view of a plasma reactor according to the fourth exemplary embodiment of the present invention.

FIG. 7 is a cross-sectional view of a plasma reactor according to the fourth exemplary embodiment of the present invention.

Referring to FIG. 7, the plasma reactor 240 according to the fourth exemplary embodiment includes the same elements as the third exemplary embodiment described above, except that a diameter of the first insulating part 31 is smaller than that of the first ground electrode 21. The same reference numerals are used for the same elements as the third exemplary embodiment, and different parts from the third exemplary embodiment are mainly described below.

Since strong plasma is generated inside of the first ground electrode 21 while the third ground electrode 23 is located inside of the first ground electrode 21, there is no substantial difference in the decomposition rate of hazardous materials even though a diameter of the first insulating part 31 becomes smaller. Accordingly, by downsizing the insulator 30 which is expensive, the cost of materials can be lowered, and initial installation cost of the plasma reactor 240 can be reduced.

Figure 8:
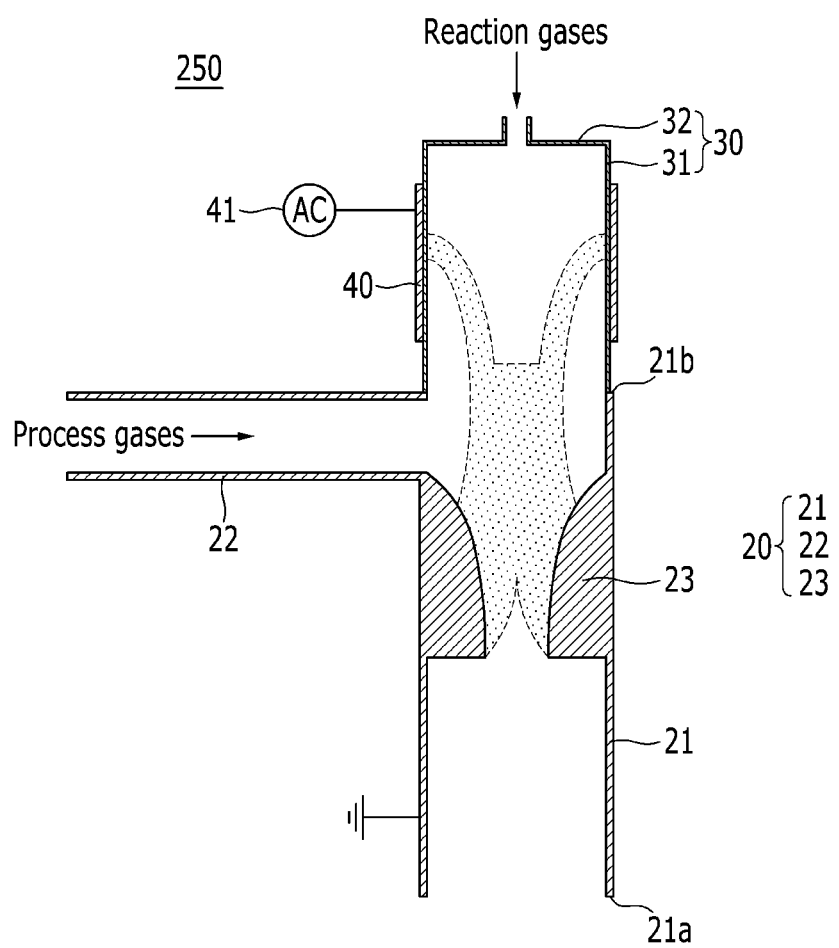
FIG. 8 is a cross-sectional view of a plasma reactor according to the fifth exemplary embodiment of the present invention.

FIG. 8 is a cross-sectional view of a plasma reactor according to the fifth exemplary embodiment of the present invention.

Referring to FIG. 8, the plasma reactor 250 according to the fifth exemplary embodiment includes the same elements as any one embodiment of the second exemplary embodiment to the fourth exemplary embodiment described above, except that the third ground electrode 23 forms an opening 235 of which width becomes smaller farther from the insulator 30 while the third ground electrode 23 has a tube shape which is fixed to the inner wall of the first ground electrode 21. In FIG. 8, a structure is shown based on the structure of the third exemplary embodiment.

The third ground electrode 23 has a predetermined length along a length direction of the first ground electrode 21, and a width of the opening 235 formed at the center of the third ground electrode 23 becomes narrower farther from the insulator 30.

In the structure of the fifth exemplary embodiment, since the third ground electrode 23 is located closer to the driving electrode in comparison with the third ground electrode with a planar shape, the discharge path is shortened when plasma discharge is induced, thereby inducing a stronger plasma discharge with the same power consumption. In addition, since strong plasma is generated at the interior center of the first ground electrode 21 through a wider area along a length direction thereof, a pressure dependency of the decomposition rate of hazardous materials can be effectively decreased.

Figure 9:
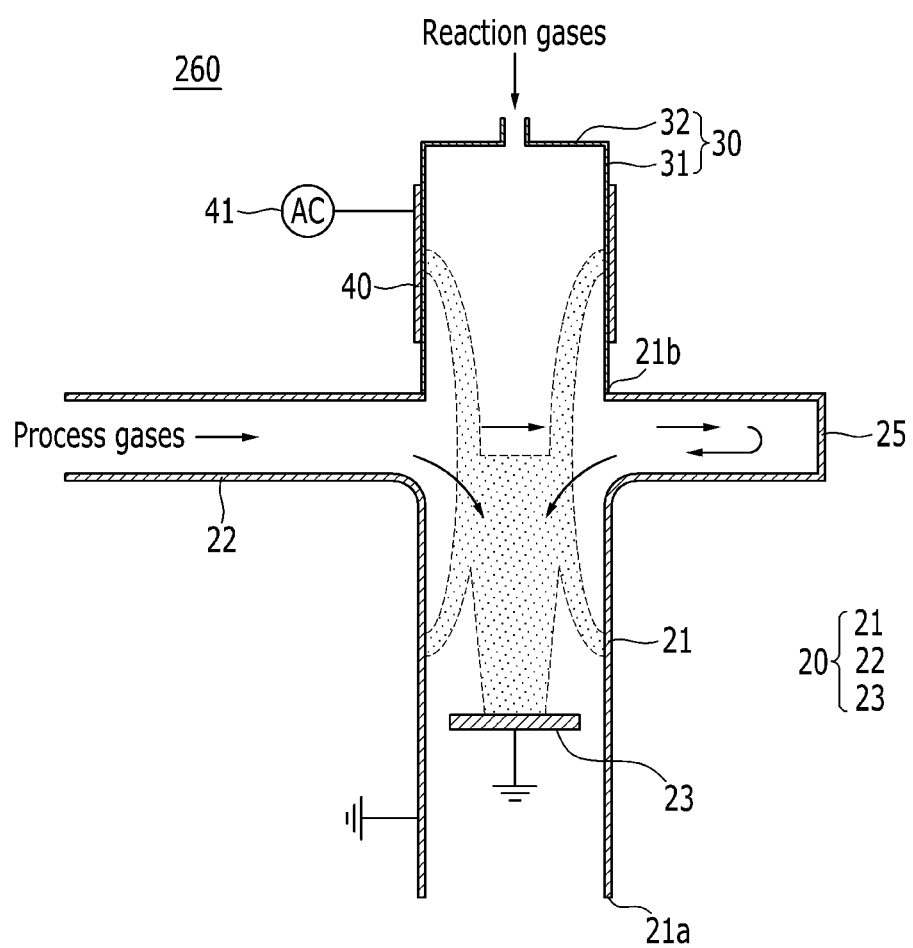
FIG. 9 is a cross-sectional view of a plasma reactor according to the sixth exemplary embodiment of the present invention.

FIG. 9 is a cross-sectional view of a plasma reactor according to the sixth exemplary embodiment of the present invention.

Referring to FIG. 9, the plasma reactor 260 according to the sixth exemplary embodiment includes the same elements as any one embodiment of the second exemplary embodiment to the fifth exemplary embodiment described above, except that a pipe member 25 of which an end is blocked is attached to the first ground electrode 21. In FIG. 9, a structure is shown based on the structure of the third exemplary embodiment.

The pipe member 25 may be attached to a side surface of the first ground electrode 21 that faces the second ground electrode 22, and may be formed with the same diameter as the second ground electrode 22. A part of the process gases inputted through the second ground electrode 22 moves to the inside of the first ground electrode 21 via the pipe member 25. The pipe member 25 functions to increase the decomposition rate of hazardous materials by increasing residence time of the process gases.

Figure 10:
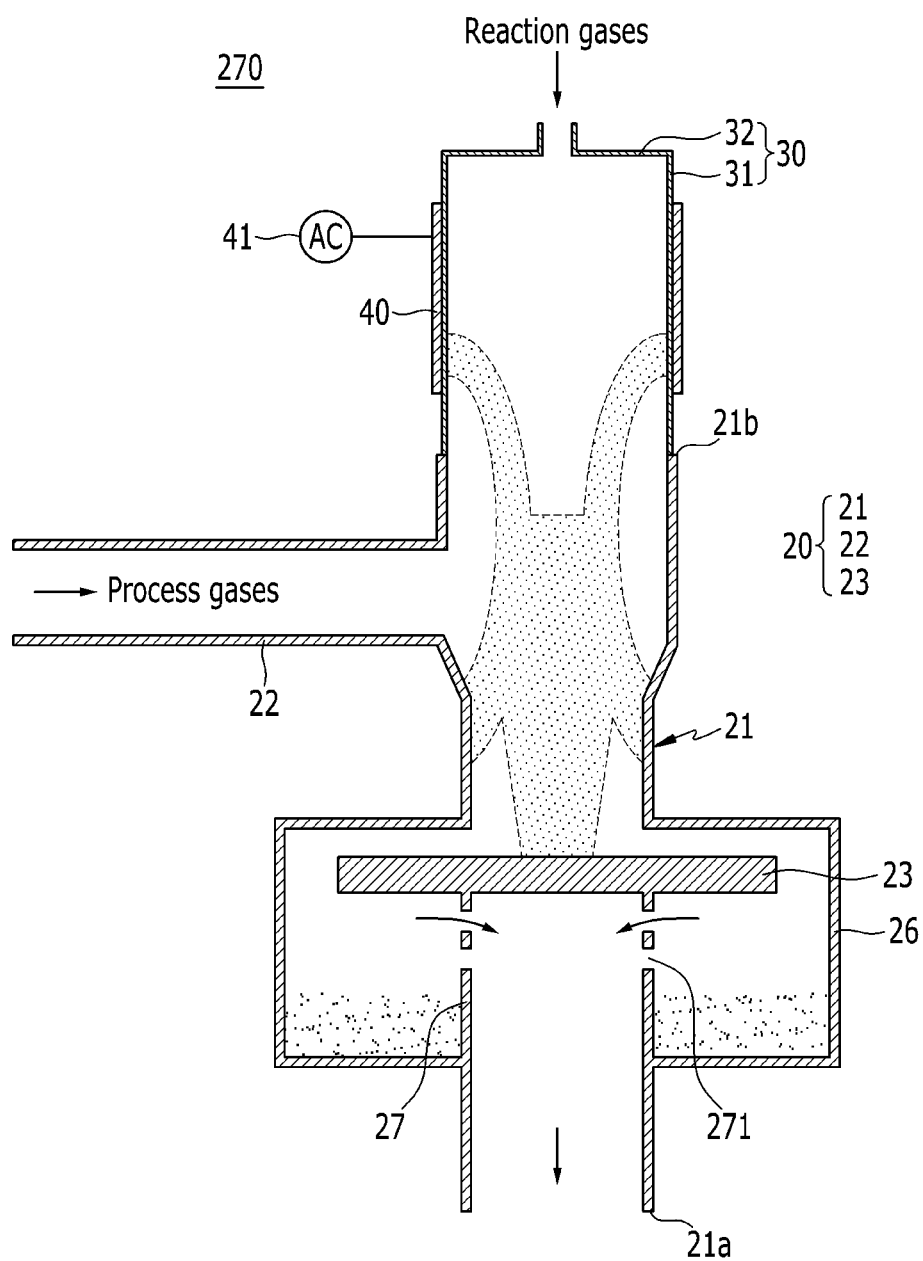
FIG. 10 is a cross-sectional view of a plasma reactor according to the seventh exemplary embodiment of the present invention.

FIG. 10 is a cross-sectional view of a plasma reactor according to the seventh exemplary embodiment of the present invention.

Referring to FIG. 10, the plasma reactor 270 according to the seventh exemplary embodiment includes the same elements as any one embodiment of the second exemplary embodiment to the fourth exemplary embodiment described above, except that a part of the first ground electrode 21 that surrounds the third ground electrode 23 is extended to function as a particle collecting box 26. In FIG. 10, a structure is shown based on the structure of the second exemplary embodiment.

The third ground electrode 23 is spaced apart by a predetermined distance from an inner wall of the particle collecting box 26, and may be formed with a diameter which is greater than that of the first ground electrode 21. The third ground electrode 23 is formed with a disk shape, and may be electrically connected with the first ground electrode 21 via a supporting part 27 which is fixed at the lower surface and maintaining a predetermined location inside of the particle collecting box 26.

The supporting part 27 is formed with at least one opening 271 for vacuum exhaust. A plurality of circular openings are formed along a circumference direction or a length direction of the supporting part 27, or an opening of slit shape may be formed lengthwise along a circumference direction or a length direction of the supporting part 27.

The hazardous materials in the process gases that flow into through the second ground electrode 22 are decomposed and removed while passing through the plasma region over the third ground electrode 23, and the process gases that have passed through move to the inside of the particle collecting box 26. In this time, the particle by-products included in the process gases are piled in the particle collecting box 26, and the remaining process gases flow into the vacuum pump 12 through the opening 271 of the supporting part 27. The structure of the seventh exemplary embodiment decreases the amount of particle by-products inflowing into the vacuum pump 12, and can increase the durability of the vacuum pump.

Figure 11:
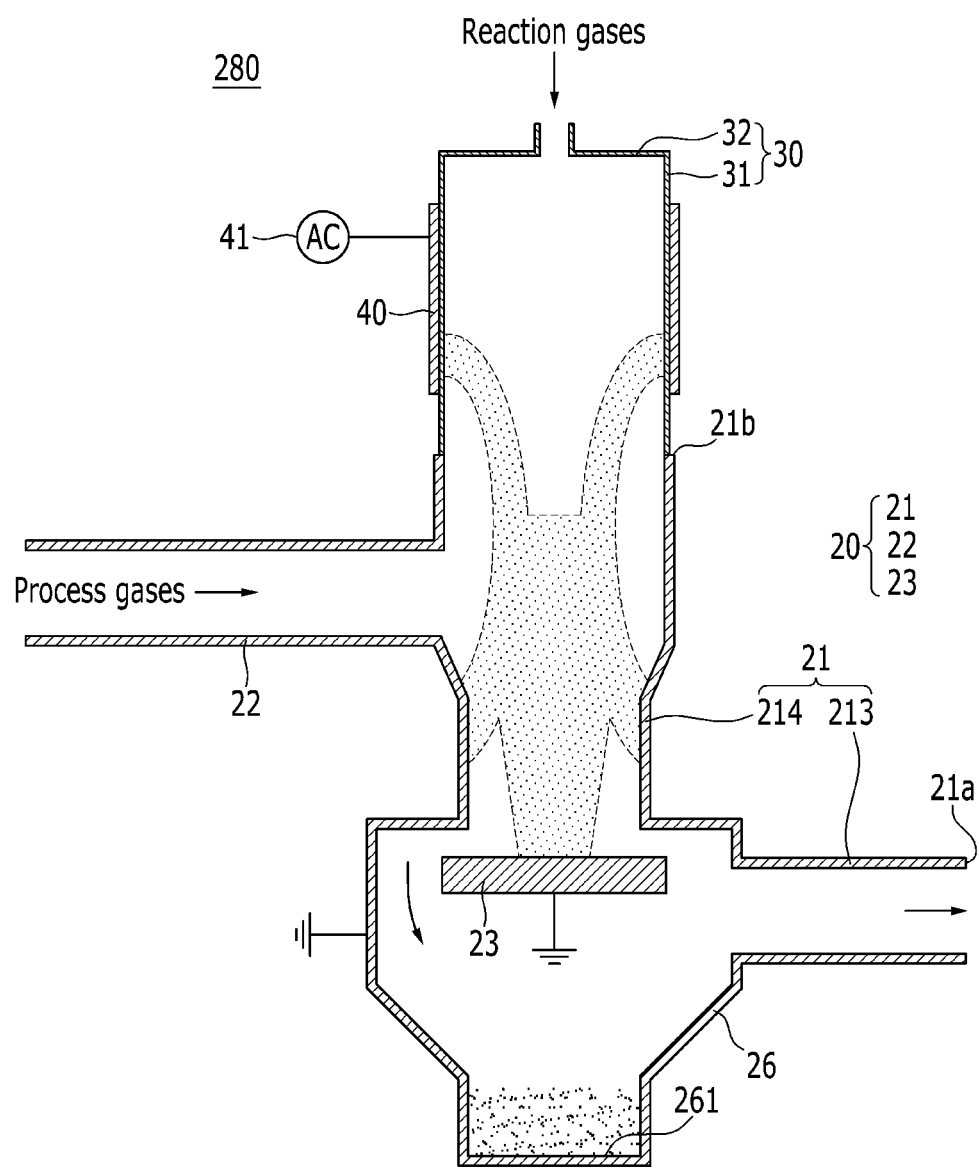
FIG. 11 is a cross-sectional view of a plasma reactor according to the eighth exemplary embodiment of the present invention.

FIG. 11 is a cross-sectional view of a plasma reactor according to the eighth exemplary embodiment of the present invention.

Referring to FIG. 11, the plasma reactor 280 according to the eighth exemplary embodiment includes the same elements as the seventh exemplary embodiment described above, except that the first ground electrode 21 is divided into two parts 213 and 214 that are orthogonal to each other with the particle collecting box 26 between them. The same reference numerals are used for the same elements as in the seventh exemplary embodiment, and different parts from the seventh exemplary embodiment are mainly described below.

The particle collecting box 26 may include a bottom part 261 with a funnel shape, and the first ground electrode 21 may include a first part 213 connected to a side surface of the particle collecting box 26 while including the first end part 21a facing the vacuum pump 12 and a second part 214 connected to the particle collecting box 26 while including the second end part 21b facing the insulator 30. The third ground electrode 23 may be electrically connected to the first ground electrode 21 while maintaining a predetermined location while being fixed to inside of the particle collecting box 26 by at least one connection part.

Hazardous materials of the process gases flowing through the second ground electrode 22 are decomposed and removed while passing through the plasma region over the third ground electrode 23, and the process gases that pass through move to the inside of the particle collecting box 26. At this time, the particle by-products included in the process gases are piled in the bottom part 261 of the particle collecting box 26, and the remaining process gases flow into the vacuum pump 12 through the first part 213 of the supporting part 27.

Figure 12:
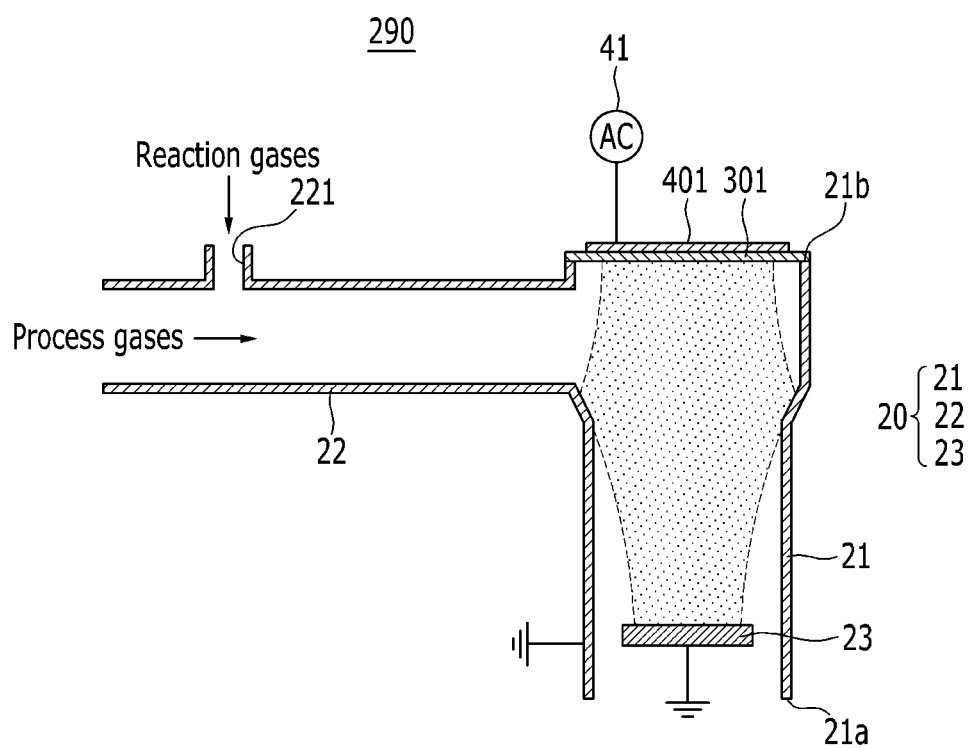
FIG. 12 is a cross-sectional view of a plasma reactor according to the ninth exemplary embodiment of the present invention.

FIG. 12 is a cross-sectional view of a plasma reactor according to the ninth exemplary embodiment of the present invention.

Referring to FIG. 12, the plasma reactor 290 according to the ninth exemplary embodiment includes the same elements as any one embodiment of the second exemplary embodiment, the third exemplary embodiment, and the fifth exemplary embodiment to the eighth exemplary embodiment described above, except that an insulator 301 and a driving electrode 401 have a planar shape. In FIG. 12, a structure is shown based on the structure of the second exemplary embodiment.

The insulator 301 has a disk shape and is fixed to the second end part 21b of the first ground electrode 21, and the driving electrode 401 also has a disk shape and is fixed to an outer surface of the insulator 301. The driving electrode 401 may be formed with a smaller diameter than that of the insulator 301. Since the insulator 301 and the driving electrode 401 have a planar shape, facing discharge is generated between the driving electrode 401 and the third ground electrode 23, and accordingly, strength of plasma can be increased, and by downsizing the insulator 301, the cost of materials can be lowered. The second ground electrode 22 may be formed with a first injection hole 321 to which the reaction gas is injected.

In all of the first to ninth exemplary embodiments, the process gases do not flow through the inside of the insulator (30 and 301), and the insulator (30 and 301) is located while being spaced apart by a predetermined distance from the flow path of the process gases. Accordingly, a decease of decomposition rate of hazardous materials which occurs by a precursor decomposed by plasma being deposited on the insulator (30 and 301) surface can be prevented, and durability of the plasma reactor can be increased by preventing a phenomenon that fluorine radicals decomposed from greenhouse gases etch the insulator (30 and 301) surface.

Figure 13:
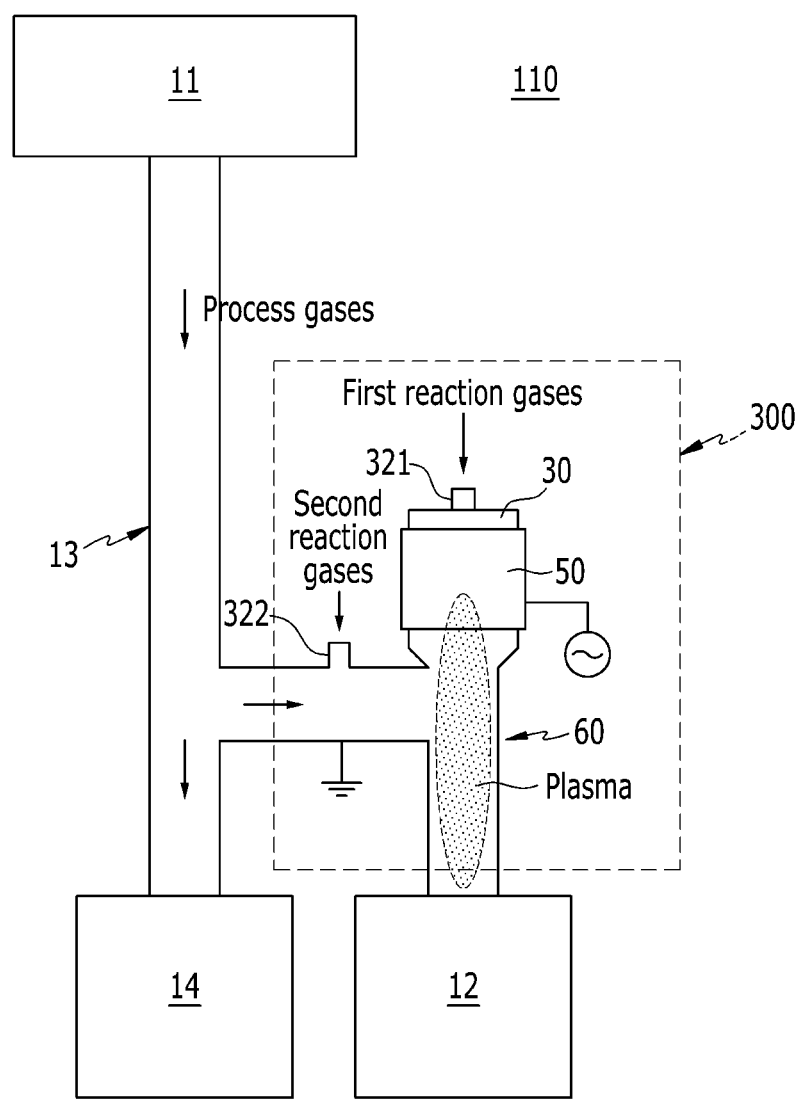
FIG. 13 is a schematic diagram of a process system including a plasma reactor according to the tenth exemplary embodiment of the present invention.
Figure 14:
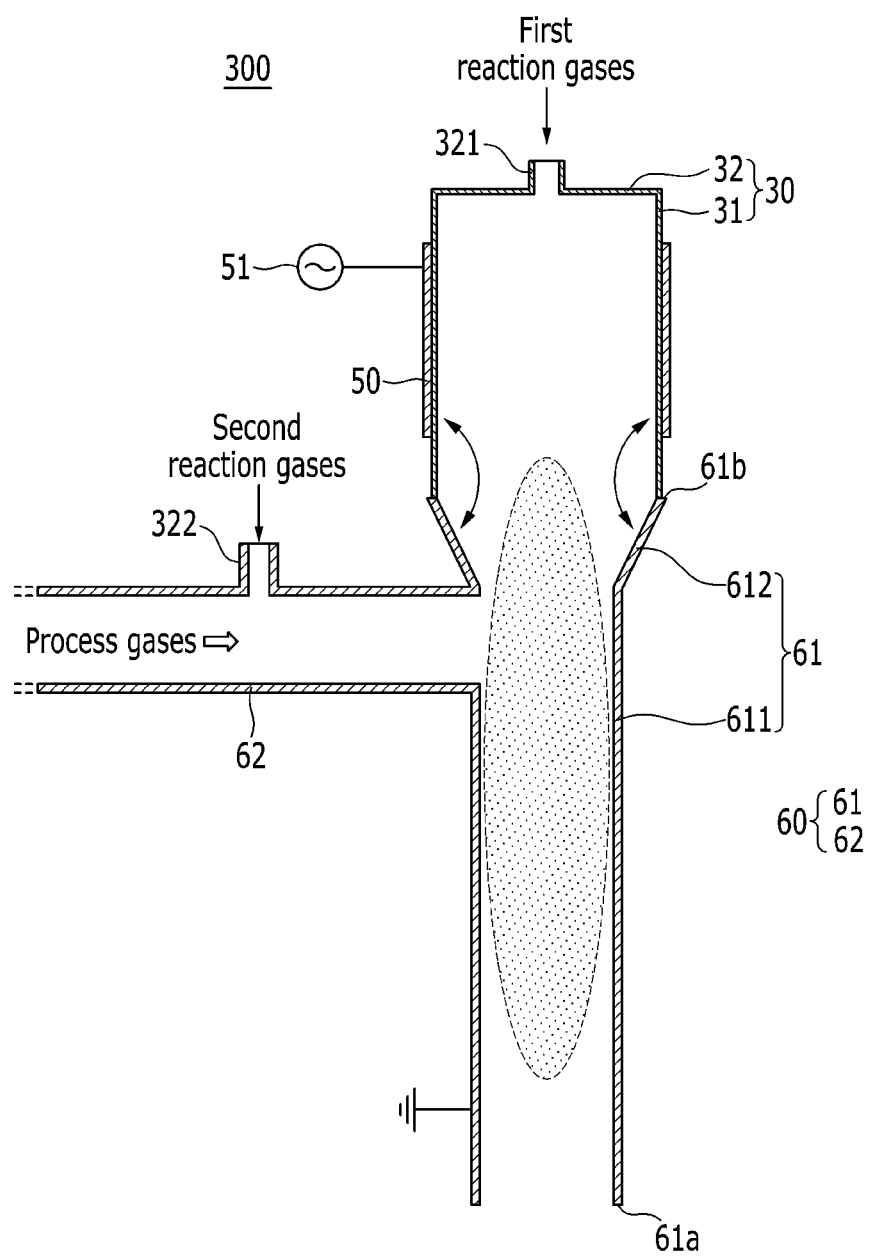
FIG. 14 is cross-sectional view of a plasma reactor according to the tenth exemplary embodiment of the present invention.

FIG. 13 is a schematic diagram of a process system including a plasma reactor according to the tenth exemplary embodiment of the present invention, and FIG. 14 is cross-sectional view of a plasma reactor according to the tenth exemplary embodiment of the present invention.

Referring to FIG. 13 and FIG. 14, a process system 110 may include the particle collecting part 14 installed in parallel with the vacuum pump 12 in a rear direction of the process chamber 11. The particle collecting part 14 is installed in parallel with the vacuum pump 12 in a rear part of the process chamber 11, and collects particles having a size of 1 μm or more.

The plasma reactor 300 according to the tenth exemplary embodiment includes a ground electrode 60 located at a front end part of the vacuum pump 12 and a driving electrode 50 fixed to an outer surface of the insulator 30. An AC or RF voltage required for plasma discharge is applied to the driving electrode 50 which is connected to a power supply 51.

The ground electrode 60 includes a first ground electrode 61 that includes a first end part 61a facing the vacuum pump 12 and a second end part 61b at the opposite side, and a second ground electrode 62 connected with a side surface of the first ground electrode 61 and that has a tubular shape for transferring process gases. DeletedTexts 61a The second ground electrode 62 is spaced apart from both the first and second end parts 61a and 61b, is but located close to the second end part 61b in order for the process gas to flow long enough inside of the first ground electrode 61. The second ground electrode 62 is equipped with a second injection hole 322 for the second reaction gas to be injected into.

The insulator 30 is connected to the second end part 61b of the first ground electrode 61 so that forms a tubular shape wholly parallel with the first ground electrode 21. The insulator 30 may include a first insulating part 31 that is fixed to the second end part 61b and has a tubular shape parallel with the first ground electrode 61, and a second insulating part 32 that forms a first injection hole 321 to which the first reaction gases are injected and has a planar shape that covers the first insulating part 31. The first and second reaction gases function as oxygen radicals and hydrogen radicals to stabilize the greenhouse gas in the decomposition process of the hazardous materials using plasma.

The first insulating part 31 may be disposed in order to accord with the central axis of the first ground electrode 61. The driving electrode 50 is fixed onto the external circumferential surface of the first insulating part 31 in a loop (cylinder) shape, and is spaced apart from the second end part 61b and the second insulating part 32 at a certain distance.

The diameters of the second end part 61b and the first insulating part 31 may be larger than that of the first end part 61a. The first ground electrode 61 may include a uniform diameter part 611 that contacts the first end part 61a, and a variable diameter part 612 that contacts the second end part 61b. The variable diameter part 612 has a diameter that becomes gradually smaller farther away from the insulator 30, and the length of uniform diameter part is much larger than that of the variable diameter part 612. The second ground electrode 62 may be connected to the end of the uniform diameter 611 that contacts the variable diameter 612.

When the driving voltage is applied to the driving electrode 50, plasma discharge occurs inside of the plasma reactor 300 (concretely, inside of the insulator 30 and the first ground electrode 61) by the voltage difference between the driving electrode 50 and the ground electrode 60, and the hazardous materials included in the process gas are decomposed and removed while passing through the plasma.

The above-described plasma reactor 300 is equipped with a cylinder-shaped insulator 30, but the process gas does not flow through the insulator 30. That is, the plasma reactor 300 decreases the contact area of the process gas and the insulator 30 by the insulator 30 being separated from the flowing path of the process.

Therefore, a phenomenon in which the precursor decomposed by plasma is deposited on the interior wall of the insulator 30, or the particle by-products decomposed by plasma and the fluorine radical decomposed from the greenhouse gases etc., etch the surface of insulator 30, can be prevented. As a result, a decrease in decomposition rate of the hazardous substances owing to a thickness increase of the insulator 30 can be prevented, and durability of the plasma reactor 300 can be effectively elongated by precluding the possibility of insulation breakdown due to etching of the insulator 30.

In addition, as the insulator 30 directly connects the variable diameter part 612 of the first ground electrode 61, the discharge path is shortened when plasma discharge is induced from the voltage difference between the driving electrode 50 and the ground electrode part 60. That is, the variable diameter part 612 of the first ground electrode 61 causes a partially similar effect to the facing discharge. Accordingly, since stronger plasma discharge is generated for the same power consumption, the efficiency of plasma discharge and the decomposition performance of hazardous substances can be increased.

Additionally, plasma is generated through the interior of the insulator 30 and the first ground electrode 61, and the second ground electrode 62 is connected to the side of the first ground electrode 61 so that the retention time of the first reaction gas in the plasma is longer than that of the second reaction gas in the plasma. Therefore, since the first reaction gas is dissociated by plasma first and mixed with the second reaction gas in the state of being dissociated, the explosion can be avoided, and an improvement in the decomposition rate of the hazardous substances can be obtained by the two kinds of reaction gases being injected instead of one.

Figure 15:
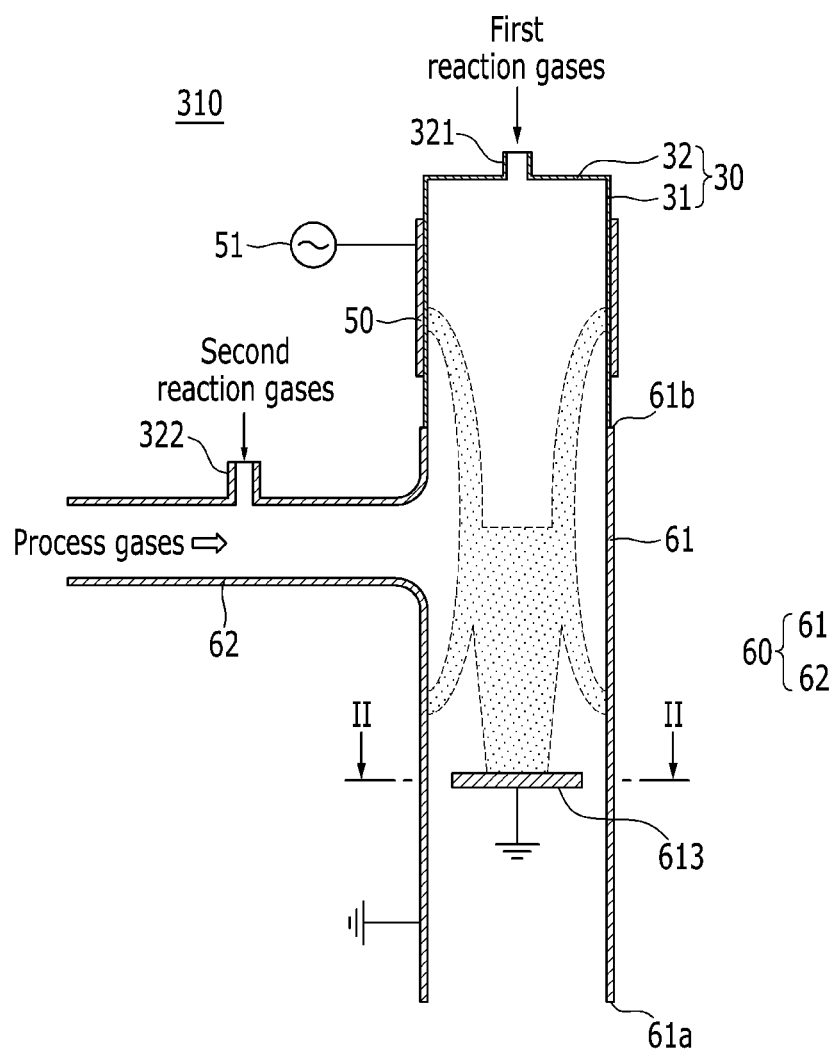
FIG. 15 is a cross-sectional view of the plasma reactor according to the eleventh exemplary embodiment of the present invention.
Figure 16:
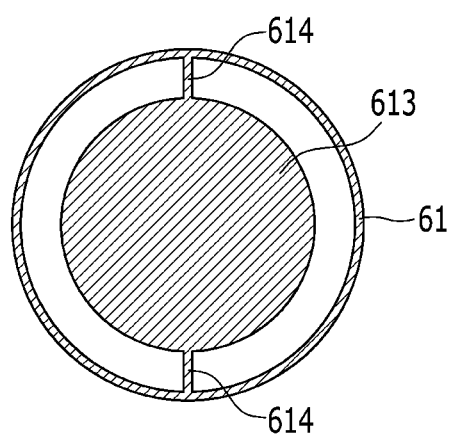
FIG. 16 is a cross-sectional view of a plasma reactor cut along the II-II line of FIG. 15.

FIG. 15 is a cross-sectional view of the plasma reactor according to the eleventh exemplary embodiment of the present invention, and FIG. 16 is a cross-sectional view of a plasma reactor cut along the II-II line of FIG. 15.

Referring to FIG. 15 and FIG. 16, the plasma reactor 310 according to the eleventh exemplary embodiment is provided with the third ground electrode 613 facing the interior center of the insulator 30 along the moving direction of the process gas. That is, the third ground electrode 613 is disposed by crossing the emission path of the process gas interior of the first ground electrode 61.

The third ground electrode 613 is located between the first end part 61a and the second ground electrode 62, and intersects the interior wall of the first ground electrode 61 in a circular disk shape. The third ground electrode 613 is formed with a smaller diameter than the internal diameter of the first ground electrode 61, and is fixed onto the inside wall of the first ground electrode 61 at at least one connection part 614, so it maintains the specified position and may be electrically connected to the first ground electrode 61. The process gas is released through the space between the interior wall of the first ground electrode 61 and the third ground electrode 613.

The plasma reactor 310 of the eleventh exemplary embodiment in which a third ground electrode 613 is added may lower the pressure dependency of the decomposition rate of the hazardous substances by intensifying the plasma density in the interior center of the first ground electrode 61.

The function of the third ground electrode 613 is the same as in the description in the second exemplary embodiment, and duplication of content will be omitted.

Figure 17:
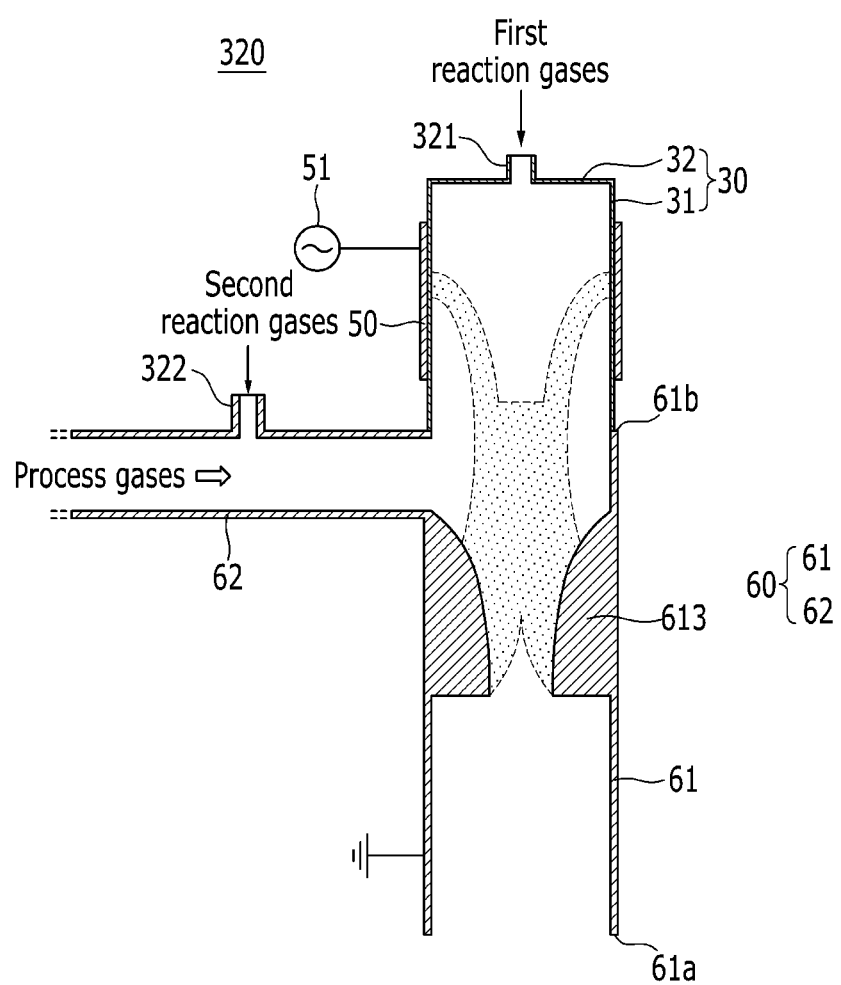
FIG. 17 is a cross-sectional view of a plasma reactor according to the twelfth exemplary embodiment of the present invention.

FIG. 17 is a cross-sectional view of a plasma reactor according to the twelfth exemplary embodiment of the present invention.

Referring to FIG. 17, a plasma reactor 320 according to the twelfth exemplary embodiment includes the same elements as the eleventh exemplary embodiment described above, except that the third ground electrode 613 forms an opening of which width becomes smaller farther from the insulator 30 while the third ground electrode 613 has a tube shape which is fixed to the inner wall of the first ground electrode 61.

In a structure of the third ground electrode 613 of the twelfth exemplary embodiment compared with the third ground electrode of the eleventh exemplary embodiment, since the third ground electrode 613 is located closer to the driving electrode 50, more powerful plasma can be generated with the same power consumption by shortening the discharge path when plasma discharge is induced. In addition, since strong plasma is generated at the interior center of the first ground electrode 61 through a wider area along a length direction thereof, pressure dependency of the decomposition rate of hazardous substances can be effectively decreased.

Figure 18:
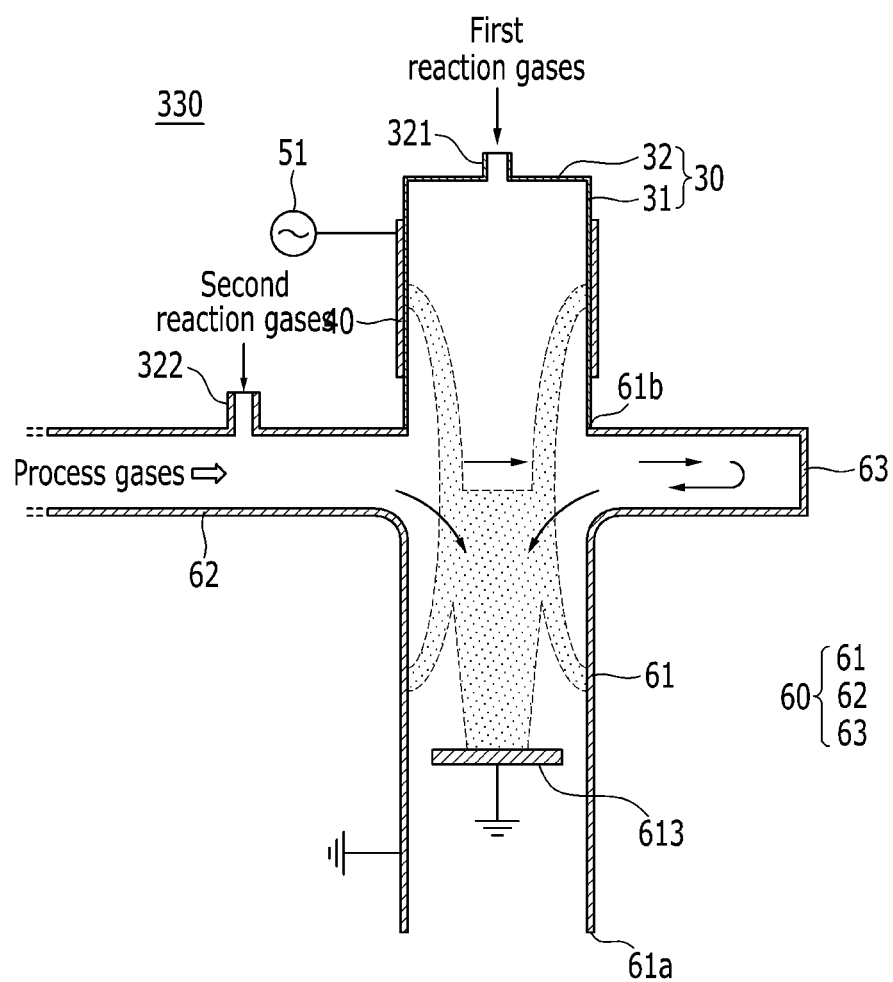
FIG. 18 is a cross-sectional view of a plasma reactor according to the thirteenth exemplary embodiment of the present invention.

FIG. 18 is a cross-sectional view of a plasma reactor according to the thirteenth exemplary embodiment of the present invention.

Referring to FIG. 18, a plasma reactor 330 according to the thirteenth exemplary embodiment includes the same elements as any one of the tenth exemplary embodiment to the twelfth exemplary embodiment described above, except that a pipe member 63 of which an end is blocked is attached to the first ground electrode 61. In FIG. 18, a structure is shown based on the structure of the eleventh exemplary embodiment.

The pipe member 63 may be attached to a side surface of the first ground electrode 61 that faces the second ground electrode 62, and may be formed with the same diameter as the second ground electrode 62. A part of the process gases inputted through the second ground electrode 62 moves to the inside of the first ground electrode 61 via the pipe member 63. The pipe member 63 functions to increase the decomposition rate of hazardous substances by increasing residence time of the process gases in the plasma.

Figure 19:
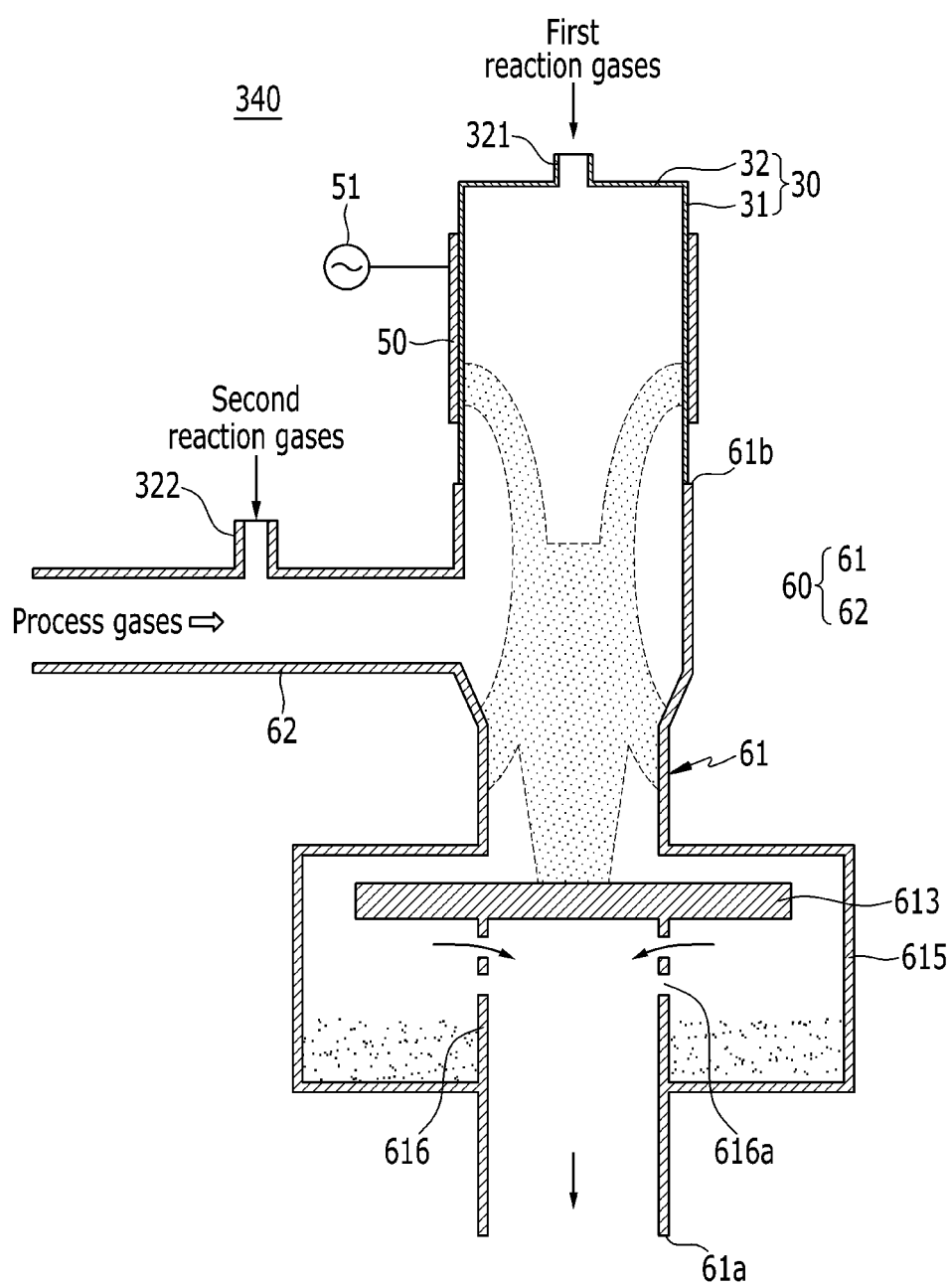
FIG. 19 is a cross-sectional view of a plasma reactor according to the fourteenth exemplary embodiment of the present invention.

FIG. 19 is a cross-sectional view of a plasma reactor according to the fourteenth exemplary embodiment of the present invention.

Referring to FIG. 19, a plasma reactor 340 according to the fourteenth exemplary embodiment includes the same elements as the eleventh exemplary embodiment described above, except that a part of the first ground electrode 61 that surrounds the third ground electrode 613 is extended to function as a particle collecting box 615.

The third ground electrode 613 is spaced apart by a predetermined distance from an inner wall of the particle collecting box 615, and may be formed with a diameter which is greater than that of the first ground electrode 61. The third ground electrode 613 is formed with a disk shape, and may be electrically connected with the first ground electrode 61 while being connected with the first ground electrode 61 via a supporting part 616 which is fixed at the lower surface and maintaining a predetermined location inside of the particle collecting box 615. The supporting part 616 is formed with at least one opening 616a for vacuum exhaust.

The hazardous substances in the process gases that flow through the second ground electrode 62 are decomposed and removed while passing through the plasma region over the third ground electrode 613, and the process gases that have passed through move to the inside of the particle collecting box 615. At this time, the particle by-products included in the process gases are piled in the particle collecting box 615, and the remaining process gases flow into the vacuum pump 12 through the opening 616a of the supporting part 616. By decreasing the amount of particle by-products that flow into the vacuum pump 12, the lifespan of the vacuum pump can be increased.

In all of the tenth exemplary embodiment to the fourteenth exemplary embodiment, the insulator 30 has an inner space for the formation of plasma, and the ground electrode is connected to at least one end part of the insulator 30. The driving electrode 50 is fixed onto the outer surface of the insulator 30, and is connected to the power supply 51 and so the AC or RF voltage is applied to it.

The first reaction gas is injected into the plasma reactor through the first injection hole 321 and the second reaction gas is injected into the plasma reactor through the second injection hole 322. The first injection hole 321 and the second injection hole 322 are spaced apart from each other, and one of the first reaction gas and the second reaction gas is dissociated by plasma in advance of the other. At this time, one of the first reaction gas and the second reaction gas includes oxygen, and the other includes hydrogen or a hydrocarbon.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 100, 110: process system | 11: process chamber |
| 12: vacuum pump | 13: pipe |
| 14: particle collecting part | |
| 210, 220, 230, 240, 250, 260, 270, 280, 290, 300, 310, 320, 330, 340: plasma reactor | |
| 20, 60: ground electrode part | 21, 41, 61: first ground electrode |
| 22, 42, 62: second ground electrode | |
| 23, 422, 613: third ground electrode | 31: first insulating part |
| 30, 301: insulator | 40, 50, 401: driving electrode |
| 32: second insulating part | 321: first injection hole |
| 41, 51: power supply | 26, 615: particle collection box |
| 322: second injection hole | |

What is claimed is:

1. A plasma reactor for abating hazardous materials included in process gases, being connectedly installed on an exhaust path of the process gases toward a vacuum pump, comprising:
   a first ground electrode located in a front end part of the vacuum pump and having a tubular shape, and including a first end part facing the vacuum pump and a second end part at an opposite side thereof;
   a second ground electrode connected to a side of the first ground electrode and having a tubular shape, and transferring the process gas;
   an insulator connectedly installed at the second end part; and
   a driving electrode fixed onto an outer surface of the insulator, to which an AC or RF voltage is applied, while being connected to a power supply.

2. The plasma reactor for abating hazardous materials of claim 1, wherein
   the insulator includes
   a first insulating part fixed to the second end part and having a tubular shape parallel with the first ground electrode and a second insulating part forming a first injection hole into which a first reaction gas is injected and having a planar shape that covers the first insulating part,
   wherein the driving electrode is fixed to an outer circumference of the first insulating part in a ring shape.

3. The plasma reactor for abating hazardous materials of claim 2, wherein
   a second injection hole for injecting a second reaction gas is formed at the second ground electrode, and
   a residence time when the first reaction gas stays inside of the plasma is different from a residence time when the second reaction gas stays inside of the plasma.

4. The plasma reactor for abating hazardous materials of claim 3, wherein one of the first reaction gas and the second reaction gas includes oxygen, and the other includes hydrogen or a hydrocarbon.

5. The plasma reactor for abating hazardous materials of claim 4, wherein one of the first reaction gas and the second reaction gas is dissociated prior to the other.

6. The plasma reactor for abating hazardous materials of claim 2, wherein
   diameters of the second end part and the first insulating part are greater than a diameter of the first end part, and
   the first ground electrode includes a uniform diameter part contacting the first end part and a variable diameter part contacting the second end part.

7. The plasma reactor for abating hazardous materials of claim 6, wherein
   a length of the variable diameter part is smaller than a length of the uniform diameter part, and
   the second ground electrode contacts an end part of the uniform diameter part contacting the variable diameter part.

8. The plasma reactor for abating hazardous materials of claim 2, further comprising a third ground electrode located inside of the first ground electrode and between the second ground electrode and the first end part.

9. The plasma reactor for abating hazardous materials of claim 8, wherein
   the third ground electrode is formed with a planar shape that intersects an inner wall of the first ground electrode, and passes the process gases by being spaced apart from the first ground electrode or forming at least one opening.

10. The plasma reactor for abating hazardous materials of claim 8, wherein the third ground electrode is formed with a tubular shape fixed to an inner wall of the first ground electrode, and is formed with an opening of which width decreases farther from the insulator.

11. The plasma reactor for abating hazardous materials of claim 8, further comprising a pipe member of which an end is blocked and is attached at a side surface of the first ground electrode that faces the second ground electrode in order to increase residence time of the process gases.

12. The plasma reactor for abating hazardous materials of claim 8, wherein
   a part of the first ground electrode surrounding the third ground electrode is expanded and functions as a particle collecting box, and
   the third ground electrode is formed with a larger diameter than a diameter of the first ground electrode in the particle collecting box.

13. The plasma reactor for abating hazardous materials of claim 12, wherein the third ground electrode is connected to the first ground electrode via a supporting part fixed at a lower surface, and the supporting part forms at least one opening for passing the process gases.

14. The plasma reactor for abating hazardous materials of claim 12, wherein the first ground electrode includes a first part connected to a side surface of the particle collecting box with the first end part, and a second part connected to an upper surface of the particle collecting box with the second end part.

15. The plasma reactor for abating hazardous materials of claim 2, wherein the second ground electrode contacts the second end part or is spaced apart from the second end part, wherein the entire first ground electrode is formed with uniform diameter, and the first insulating part is formed with a diameter that is the same as or smaller than a diameter of the first ground electrode.

16. The plasma reactor for abating hazardous materials of claim 1, wherein the insulator is formed with a planar shape that covers the second end part, and the driving electrode is fixed to an outer surface of the insulator with a planar shape.

\* \* \* \* \*